(12) United States Patent
Dunning et al.

(10) Patent No.: US 6,943,606 B2
(45) Date of Patent: Sep. 13, 2005

(54) PHASE INTERPOLATOR TO INTERPOLATE BETWEEN A PLURALITY OF CLOCK PHASES

(75) Inventors: Davied S. Dunning, Portland, OR (US); Chamath Abhayagunawardhana, Portland, OR (US); Ken Drottar, Portland, OR (US); Richard S. Jensen, Aloha, OR (US); Robert Glenn, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 637 days.

(21) Appl. No.: 09/891,466

(22) Filed: Jun. 27, 2001

(65) Prior Publication Data

US 2003/0002596 A1 Jan. 2, 2003

(51) Int. Cl.[7] .............................................. H03H 11/16
(52) U.S. Cl. ...................................... 327/231; 327/246
(58) Field of Search ................................. 327/231, 232, 327/233, 234, 235, 237, 240, 246

(56) References Cited

U.S. PATENT DOCUMENTS

| | | | |
|---|---|---|---|
| 6,002,279 A | | 12/1999 | Evans et al. ................. 327/144 |
| 6,133,773 A | * | 10/2000 | Garlepp et al. ............. 327/247 |
| 6,359,486 B1 | * | 3/2002 | Chen ........................... 327/231 |

OTHER PUBLICATIONS

Dally and Poulton: *Digital Systems Engineering*, 1998, p. 604–605.

* cited by examiner

*Primary Examiner*—Linh My Nguyen
(74) *Attorney, Agent, or Firm*—Kenyon & Kenyon

(57) ABSTRACT

A phase interpolator interpolates between a plurality of clock phases using a plurality of switching legs coupled to a common output. Each switching leg includes a pair of differential switching transistors each having a gate and two additional terminals, one of which is coupled to said common output. The gates are coupled to respective ones of the plurality of clock phases and their complements. Tails couple the other terminals of said switching transistors to ground. Each tail made up of a plurality of transistors. A load coupling the common output to a voltage.

22 Claims, 4 Drawing Sheets

US 6,943,606 B2

PHASE INTERPOLATOR TO INTERPOLATE BETWEEN A PLURALITY OF CLOCK PHASES

FIELD OF THE INVENTION

Embodiments of the present invention relate to phase interpolators in general and more particularly to such an interpolator useful in recovering a clock from serial data in a tracking receiver.

BACKGROUND OF THE INVENTION

In many data communication arrangements, no separate clock signals are transmitted. This requires recovering the clock at the receiving end in order to then recover the data. This can be characterized as the problem, in digital communications, of transferring digital signals between multiple clock timing domains. Multiple clock timing domains include the clock timing domain of a transmitting device as well as the clock timing domain of a receiving device. It is not unusual to transmit digital signals between clock timing domains having nearly the same underlying frequency clock, but different or varying phases with respect to each other.

In the prior art, clock recovery circuits provide clock recovery from serial data streams in devices called tracking receivers. Various tracking architectures have been used for this purpose. For example, phase locked loop (PLL) based and delay locked loop (DLL) based tracking architectures have been used. These circuits have various disadvantages. A PLL is an oscillator and injects noise into the surrounding substrate/system. Furthermore, a PLL uses a voltage level to control its oscillation frequency. Hence it is prone to frequency distortions introduced through very low levels of noise on the control lines. A PLL also requires an analog loop filter to damp input noise from interfering with the tracking of the remote transmit clock. This loop filter is an RC time constant network consisting of polysilicon blocks for resistance and gates for capacitance. The analog loop filter consumes a substantial amount of on-die area.

Classic DLL based tracking architectures also present problems. These also are prone to frequency distortion introduced through low levels of noise and utilize analog filters which consume a large on-die area. In addition, a DLL has a finite delay range. A DLL tracks the remote transmit clock by taking a local clock and delaying it until it matches the phase of the remote clock. If the remote clock skews over time or temperature the DLL tracking this clock must add or subtract delay to its local version. If the DLL is asked to delay less than zero, it must add a bit time to that delay to remain within its functional range. Complex circuitry must ignore the additional bit that the adjustment action of the DLL inserts into the recovered data stream. This circuitry must also insert a bit into the recovered data stream when the DLL is asked to delay more than its fixed range.

An approach to digital phase interpolation which overcomes some of these disadvantages is disclosed in *Digital Systems Engineering*, 1998, by Dally and Poulton, p. 604–605. The interpolator is described as similar to a typical delay stage but has two differential pairs. In a digitally controlled embodiment, a plurality of digitally controlled tails on each of the differential pairs are provided to select different phases, between two import phases. This avoids some of the problems noted above with PLL and DLL architectures. However, this approach has its own problems. For example, this circuit could require a multiplexer circuit for selecting source clocks. This adds undue additional circuitry and clock distortion during switching. The textbook interpolator also requires a (noise prone) voltage bias to keep the tail current transistors saturated. Furthermore, common mode noise due to charge injection at the nodes between the tail and switching transistors is a problem which is described, but not solved, in the textbook version, when using equally weighted current sources.

A need, therefore, exists for a phase interpolator which avoids the problems found in these various prior art architectures.

DETAILED DESCRIPTION

Embodiments of methods and systems for clock recovery are described. In the following description, for purposes of explanation, numerous specific details are set forth to provide a thorough understanding of the present invention. It will be appreciated, however, by one skilled in the art, that the present invention may be practiced without these specific details. In other instances, structures and devices are shown in block diagram form. Furthermore, one skilled in the art can readily appreciate that the specific sequence in which methods are presented and performed are illustrative and it is contemplated that the sequences can be varied and still remain within the spirit and scope of the present invention.

Figure 1:
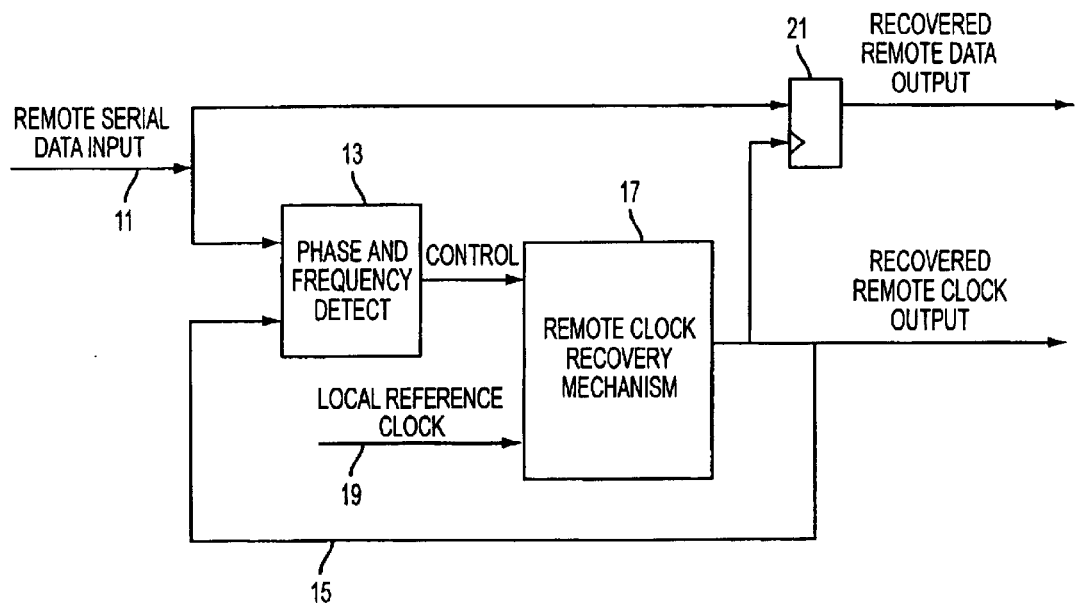
FIG. 1 is a block diagram of a tracking receiver of the type in which a phase interpolator in accordance with an embodiment of the present invention may be used.

FIG. 1 is a block diagram of a typical tracking receiver in which embodiments of the phase interpolator of the present invention may be used. Remote serial data on line 11 is input to a phase and frequency detect circuit 13, which has as a second input the recovered remote clock signal on line 15. A control output from block 13, which represents the difference in phase is an input to a remote clock recovery mechanism 17, having as a second input a local reference clock on line 19. The control signal is used to vary the phase of the local reference clock until the recovered clock phase is in a desired frequency and phase relationship with the incoming data. The recovered clock on line 15 is provided as an output and is used as a clock input to flip-flop 21 which is used to recover the data.

Figure 2:
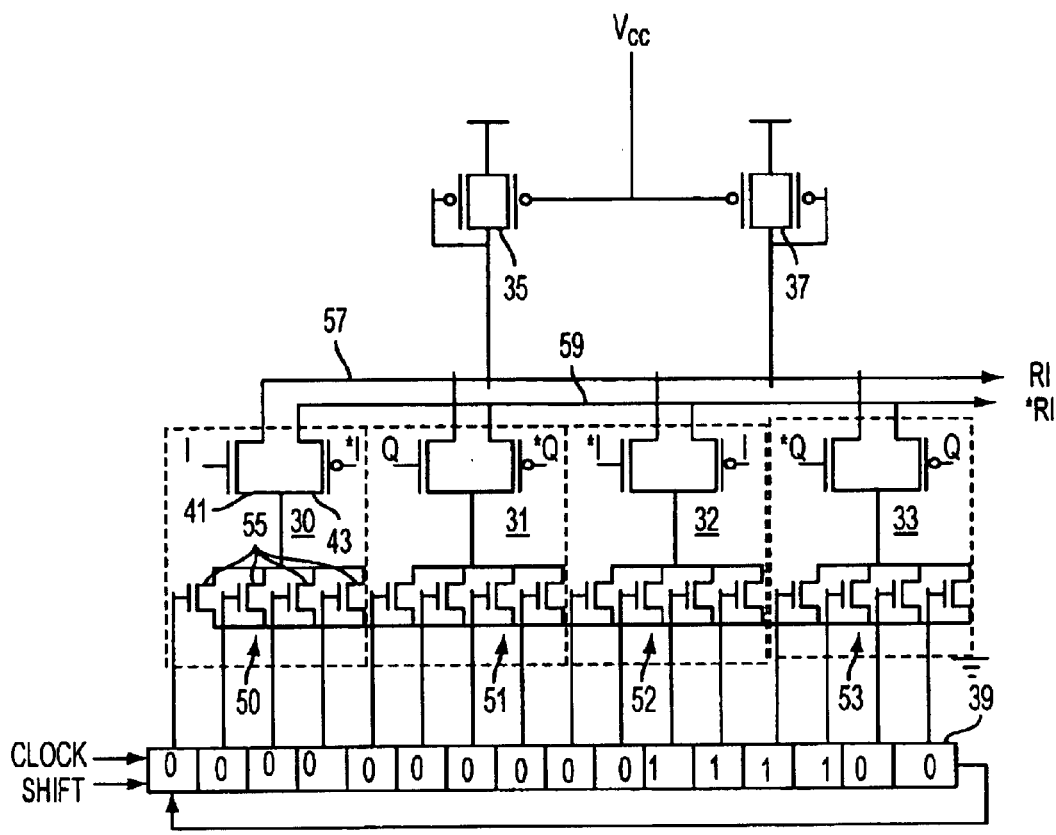
FIG. 2 is circuit/block diagram of an embodiment of an interpolation circuit according to the present invention.
Figure 2A:
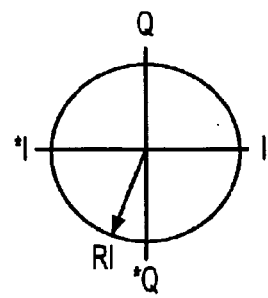
FIG. 2A is a phase diagram helpful in understanding the operation of the embodiment of FIG. 2.

FIG. 2 is a circuit/block diagram of an embodiment of phase interpolator according to the present invention. This can be used as the remote clock recovery mechanism 17 in a system such as that of FIG. 2. However, the implementation is FIG. 2 is useful in any arrangement where interpolation between different clock phases is desired. In the illustrated embodiment, from four phases (I, *I, Q and *Q) of a reference clock (also shown on the phase diagram of FIG. 2A), the invention creates one of N phases, indicated by the arrow in FIG. 2A, of that reference clock and its complement as its output. The number of phases that can be created directly corresponds to the size of the digital control, N bits. The example shown in FIG. 2 uses 16 bits of digital control to deliver one of 16 phases of the reference clock and its complement as its output. Depending on requirements, more or fewer bits may be used. It is also possible to begin with fewer, e.g., 2 or more, e.g., 8 reference clock phases. It will be recognized by those skilled in the art that there is a trade-off between control and precision. The more phases, the more precision and the fewer phases, the simpler the control is.

The embodiment of FIG. 2, because it uses digital control, is essentially immune to low level noise on the control lines and can exploit a digital loop filter which consumes less on-die area than the analog circuits of the prior art PLL and DLL implementations. None of this additional circuitry is required to implement embodiments of the present invention. Essentially, embodiments of the present invention do digitally what was normally done in analog fashion in the prior art.

In the illustrated embodiment four switching "legs" 30, 31, 32 and 33, all tied to common complementary outputs R1, *R1, are provided. Each of the outputs R1 and *R1 of the switching legs 30–33 is coupled to Vcc through a load, 35 and 37 respectively, made up of a pair of transistors in a diode/triode configuration. A recirculating shift register 39 is used to generate N (in the example 16) phases of the local reference clock. Each switching leg 30–33 includes a differential pair with the drains of the two transistors 41 and 43 coupled together and to ground through a common tail 50, 51, 52, or 53. In the illustrated embodiment, each common tail includes four equally weighted current sources 55 which are enabled and disabled through digital control by the outputs of the shift register 39. The differential transistors 41 and 43 have on their gates a phase of the reference clock and its corresponding complement.

Specifically, in leg 30 transistor 41 has on its gate the in-phase reference clock I and transistor 43 has the inverse thereof. In leg 31, the reference clock quadrature signal Q is provided to transistor 41 and its inverse to transistor 43. Transistor 41 in leg 32 has as its gate input the inverse of I, that is *I and transistor 41 in leg 33 the clock phase *Q.

Figure 3:
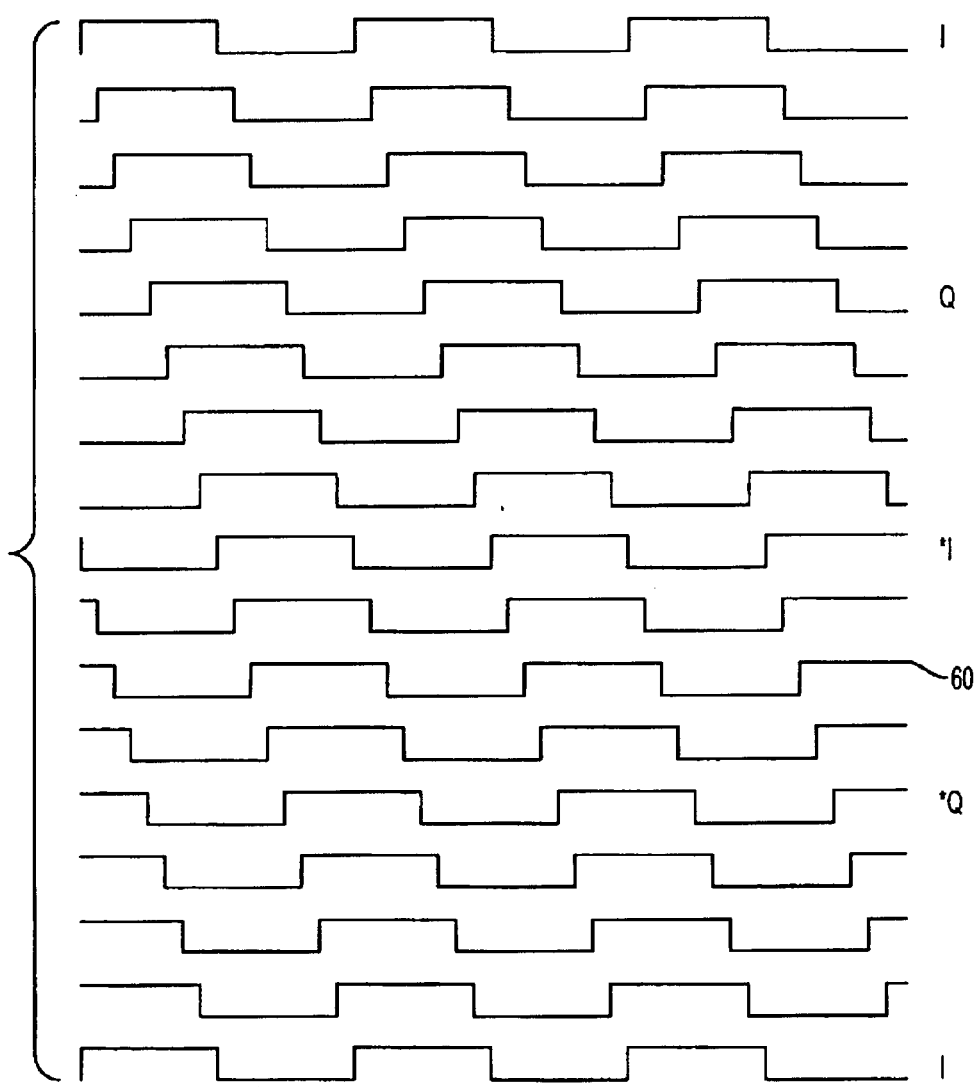
FIG. 3 is a waveform diagram showing phases available in the phase interpolation of the embodiment of FIG. 2
Figure 4A:
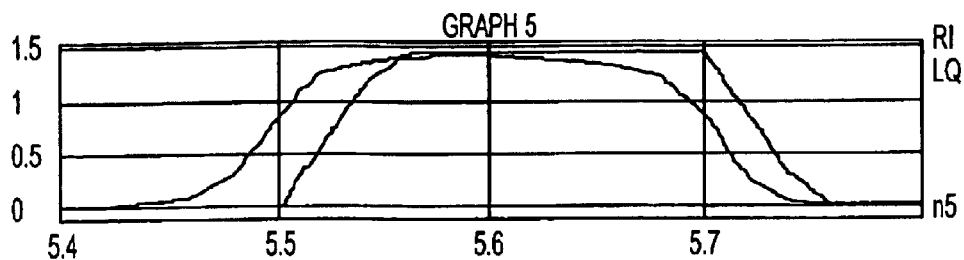
FIG. 4 illustrates a number of waveforms helpful in understanding operation of embodiments of the present invention.
Figure 4B:
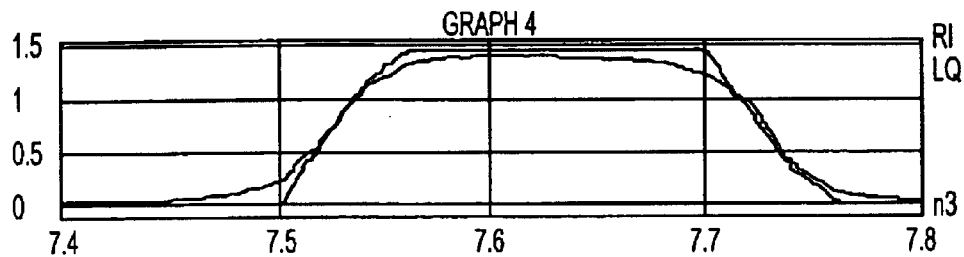
Figure 4C:
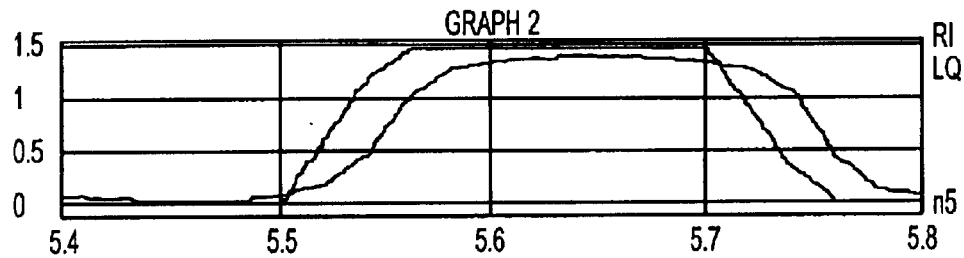
Figure 4D:
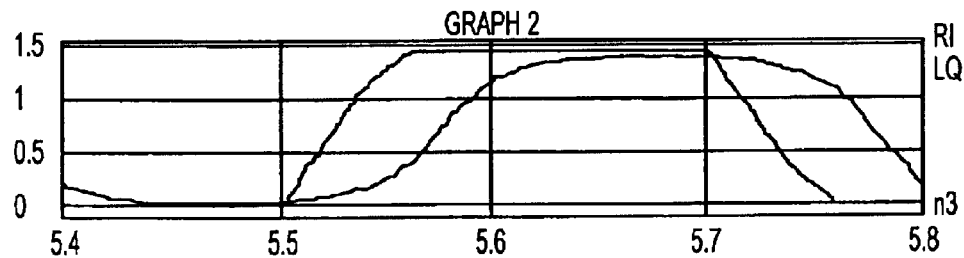
Figure 4E:
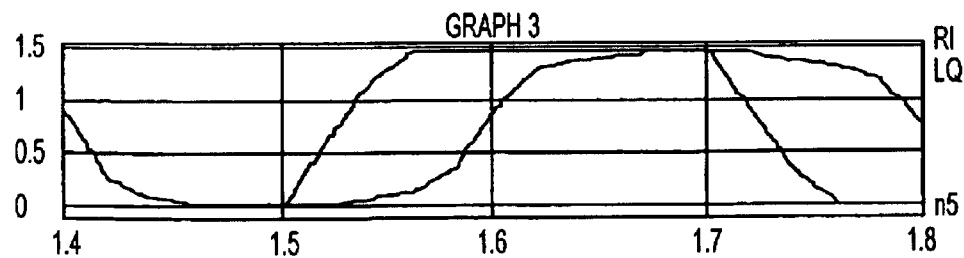

By selectively enabling and disabling current sources, such that only four adjacent are ever enabled it is possible to interpolate between these four phases as shown in FIG. 3. The phase and frequency shift block 13 of FIG. 1 compares data transitions with recovered clock transitions and outputs a signal which shifts the bits in the shift register 39 to change the phase. Thus, embodiments of the present invention provide all phases needed for every phase of interpolation, reducing transistor count and improving noise immunity. The switches 41 and 43 will sum through common output rails 57 and 59 and create phases of the reference clock between those provided by the reference clock. The resultant phase is dependent on the ratio of current sources enabled at each adjacent leg. Thus, with the first four bits of shift register 39 enabling the four transistors 55 in tail 50, the output will be the I phase. As the four bits are shifted the phase will change as shown on FIG. 3. After shifting four places, all four transistors 55 of tail 52 will be enabled and the Q phase will be output. With the four bits as shown in FIG. 2, two transistors 55 in leg 32 and two in leg 33 will be enabled. The interpolated output would be the clock phase 60 of FIG. 3, halfway between *I and *Q.

The outputs R and R* can be coupled through "clean up" circuit that is tuned to match the crossing point of the interpolator. Such circuits are well known and typically include an tuned inverter with a P device and N and device with the switching point set by varying gate width so that the inverter switches between logic 1 and logic zero at same point as previous stage so as to avoid distortion.

In one particular implementation the circuit is implemented with a 0.16 micron minimum channel length. In this particular embodiment, each transistor size is selected very carefully, as the circuit is tuned to deliver even delay intervals with very low power consumption and high noise immunity. For example, load transistors may be 7/0.32 (w/l), switching transistors may be 30/0.32, and current tails may be 1.3/0.32. They are drawn double minimum length to guarantee some level of uniformity such that each will have equal effect and influence on the circuit. Rule of thumb in these instances is usually triple minimum, however, the circuit would not switch with transistors that size.

The embodiment disclosed above uses specific sizes of transistors chosen to behave in the same fashion using a simple digital interface, without additional complexity of voltage bias as in the prior art textbook circuit. Large switching transistors are used to reject some common mode noise due to charge injection at the nodes between the tail and switching transistors, to overcome the problem documented, but not solved in the textbook version, when using equally weighted current sources. In addition, the large switching transistors deliberately load the input clocks such that their rise and fall time are equal to or larger than one quarter of the input clock period.

The above-described embodiment uses very small load and current source transistors to reduce the interpolator output to very small (400 mv differential) signals. This retains the integrity of the crossing without introducing non-linearities which introduced by the interpolator if signal swung to the extremes of the voltage rails.

FIG. 4 shows a comparison of a reference 2.5 GHz input waveform to the output as it passes through four stages of 25 ps delay (each) in an embodiment such as that described above.

Embodiments of the present invention have wide application providing reduced power, area, and pin occupancy in various I/O signaling technologies. These embodiments are applicable to many types of serial interfaces including copper, optical, and chip to chip. Embodiments of the present invention can be used to correct clock skew across a large die, replacing the multiple PLL's which have been used in some applications with the efficiencies and savings mentioned above.

For example further noise reduction through addition of a filter on the tail are possible, but not deemed necessary in the illustrated. Furthermore although not necessary in this embodiment, the addition of a "keep alive" current on each current tail would further improve noise immunity by keeping each leg partially enabled.

Thus, although several embodiments are specifically illustrated and described herein, it will be appreciated that modifications and variations of the present invention are covered by the above teachings and within the purview of the appended claims without departing from the spirit and intended scope of the invention.

What is claimed is:

1. A phase interpolator, to interpolate between a plurality of clock phases, comprising:
    a. a plurality of switching legs coupled to a common output, each including:
        i. a pair of differential switching transistors each having a gate and two additional terminals, one of which is coupled to said common output, the gates coupled to a respective one of said plurality of clock phases and its complement;

ii. a tail coupling the other terminal of said switching transistors directly to ground without bias, said tail made up of a plurality of transistors; and b. a load coupling the common output to a voltage.

2. The phase interpolator of claim 1 wherein said plurality of clock phases comprises four phases.

3. A phase interpolator, to interpolate between a plurality of clock phases, comprising:

a. a plurality of switching legs coupled to a common output, each including:
i. a pair of differential switching transistors each having a gate and two additional terminals, one of which is coupled to said common output, the gates coupled to a respective one of said plurality of clock phases and its complement:
ii. a tail comprising coupling the other terminal of said switching transistors to ground, said tail made up of four transistors in parallel to make available 16 phases of a reference clock and its complement; and b. a load coupling the common output to a voltage.

4. A phase interpolator, to interpolate between a plurality of clock phases, comprising:

a. a plurality of switching legs coupled to a common output, each including:
i. a pair of differential switching transistors each having a gate and two additional terminals, one of which is coupled to said common output, the gates coupled to a respective one of said plurality of clock phases and its complement;
ii. a tail coupling the other terminal of said switching transistors to ground, said tail made up of a plurality of transistors;

b. a load coupling the common output to a voltage; and c. an N bit digital control, where N equals the total number of transistors in said tails, said control having N outputs coupled to respective gates in the transistors in said tails.

5. The phase interpolator of claim 1 wherein said plurality of clock phases include all phases needed for every phase of interpolation.

6. The phase interpolator of claim 4 wherein the size of said tail transistors is chosen such that when a control signal is coupled to turn on said transistor, said transistor operated in a saturated condition without any voltage bias.

7. The phase interpolator of claim 1 wherein said switching transistors are of large enough size to reject some conunon mode noise due to charge injection at nodes between the tail and switching transistors.

8. A phase interpolator, to interpolate between a plurality of clock phases, comprising:

a. a plurality of switching legs coupled to a common output, each including:
i. a pair of differential switching transistors each having a gate and two additional terminals, one of which is coupled to said common output, the gates coupled to a respective one of said plurality of clock phases and its complement;
ii. a tail coupling the other terminal of said switching transistors to ground, said tail made up of a plurality of transistors; and b. a load coupling the common output to a voltage, wherein c. said switching transistors are of large enough size to reject some common mode noise due to charge injection at nodes between the tail and switching transistors; and d. said switching transistors are large enough to load the input clocks such that they have a rise and fall times that are equal to or larger than one quarter of an input clock period.

9. The phase interpolator of claim 1 wherein said load is provided by load transistors and said load transistors and said tail transistors are selected to be of a size to reduce the interpolator output to very small signals.

10. A phase interpolator, to interpolate between four input clock phase signals, said phases including an in-phase signal, a quadrature signal and the complements of said in-phase signal and quadrature signal, comprising:

a. an common output line and a common complemented output line;

b. four switching legs, each including:
i. a pair of differential switching transistors each having a gate, the respective gates coupled respective ones of said plurality of clock phases and their complements, each differential switching transistors coupled to a respective one of the common output line and the common complemented output line;
ii. a tail coupling the other terminal of said switching transistors to ground, said tail made up of a plurality of transistors; and c. a load, including at least one transistor, coupling the common output to a voltage.

11. The phase interpolator of claim 10 wherein each of said tails comprises M transistors in parallel to make available N phases of the reference clock and its complement and further including an N bit digital control, where M equals 4 times N, the total number of transistors in said tails, said control having N outputs coupled to respective gates in the transistors in said tails.

12. The phase interpolator of claim 11 wherein said digital control comprises a shift register in which a group of M bits enables M adjacent tail transistors to select one of said phases.

13. The phase interpolator of claim 12 wherein M equals 4.

14. The phase interpolator of claim 10 wherein:

a. the size of said tail transistors is chosen such that when a control signal is coupled to turn on said transistor, said transistor operated in a saturated condition without any voltage bias;

b. the size of said switching transistors is large enough to reject some common mode noise due to charge injection at nodes between the tail and switching transistors and large enough to load the input clocks such that they have a rise and fall times that are equal to or larger than one quarter of an input clock period; and c. said load transistors and said tail transistors are selected to be of a size to reduce the interpolator output to very small signals.

15. The phase interpolator of claim 14 wherein:

a. the size of said switching transistors is about 30/0.32 b. the size of said tail transistors is about 1.3/0.32; and c. the size of said load transistors is about 7/0.32.

16. A tracking receiver comprising:

a. a phase and frequency detector having as inputs a remote serial data input and a recovered remote clock output;

b. a local reference clock providing a plurality of clock phases; and c. a remote clock recovery mechanism comprising:
i. a common output providing said remote recovered clock output;

ii. a plurality of switching legs, each including:
  (1) a pair of differential switching transistors each having a gate and two additional terminals, one of which is coupled to said common output, the gates coupled to a respective one of said plurality of clock phases and its complement;
  (2) a tail coupling the other terminal of said switching transistors to ground, said tail made up of a plurality of transistors;
  (3) an N bit digital control, where N equals the total number of transistors in said tails, said control receiving a control input from said phase and frequency having N outputs coupled to respective gates in the transistors in said tails; and
ii. a load coupling the common output to a voltage.

17. The tracking receiver of claim 16 wherein said plurality of clock phases comprises four phases.

18. The tracking receiver of claim 17 wherein each of said tails comprises M transistors in parallel to make available N phases of the reference clock and its complement.

19. The tracking receiver of claim 18 wherein said digital control comprises a shift register in which a group of M bits enables M adjacent tail transistors to select one of said phases.

20. The tracking receiver of claim 19 wherein M equals 4.

21. The tracking receiver of claim 16 wherein:
a. the size of said tail transistors is chosen such that when a control signal is coupled to turn on said transistor, said transistor operated in a saturated condition without any voltage bias;
b. the size of said switching transistors is large enough to reject some common mode noise due to charge injection at nodes between the tail and switching transistors and large enough to load the input clocks such that they have a rise and fall times that are equal to or larger than one quarter of an input clock period; and
c. said load transistors and said tail transistors are selected to be of a size to reduce the interpolator output to very small signals.

22. The tracking receiver of claim 21 wherein:
a. the size of said switching transistors is about 30/0.32
b. the size of said tail transistors is about 1.31/0.32; and
c. the size of said load transistors is about 7/0.32.

* * * * *

UNITED STATES PATENT AND TRADEMARK OFFICE
CERTIFICATE OF CORRECTION

PATENT NO. : 6,943,606 B2
APPLICATION NO. : 09/891466
DATED : September 13, 2005
INVENTOR(S) : Kenneth Drottar et al.

It is certified that error appears in the above-identified patent and that said Letters Patent is hereby corrected as shown below:

| | |
|---|---|
| Column 6, Line 17 | "coupled respective ones" should be --coupled to respective ones-- |
| Column 6, Line 49 | "a rise and fall times that are" should be --rise and fall times that are-- |
| Column 6, Line 56 | "is about 30/0.32" should be --is about 30/0.32;-- |
| Column 8, Line 6 | "said transistor operated" should be --said transistor is operated-- |
| Column 8, Line 16 | "is about 3/0.32" should be --is about 30/0.32;-- |

Signed and Sealed this

Twenty-eighth Day of November, 2006

JON W. DUDAS
*Director of the United States Patent and Trademark Office*